(12) United States Patent
Washio et al.

(10) Patent No.: US 8,525,539 B2
(45) Date of Patent: Sep. 3, 2013

(54) ELECTRICAL CONNECTING APPARATUS AND TESTING SYSTEM USING THE SAME

(75) Inventors: Kenichi Washio, Kanagawa (JP); Masashi Hasegawa, Tokyo (JP)

(73) Assignee: Kabushiki Kaisha Nihon Micronics, Tokyo (JP)

(*) Notice: Subject to any disclaimer, the term of this patent is extended or adjusted under 35 U.S.C. 154(b) by 335 days.

(21) Appl. No.: 12/907,878

(22) Filed: Oct. 19, 2010

(65) Prior Publication Data

US 2011/0095779 A1  Apr. 28, 2011

(30) Foreign Application Priority Data

Oct. 22, 2009 (JP) .................................. 2009-243664

(51) Int. Cl.
*G01R 31/00* (2006.01)

(52) U.S. Cl.
USPC .................................. 324/756.05; 324/756.01

(58) Field of Classification Search
None
See application file for complete search history.

(56) References Cited

U.S. PATENT DOCUMENTS

| | | | |
|---|---|---|---|
| 5,600,257 A | 2/1997 | Leas et al. | |
| 6,791,347 B2* | 9/2004 | Ishizaka et al. | 324/750.05 |
| 7,759,952 B2* | 7/2010 | Garabedian et al. | 29/755 |
| 8,253,433 B2* | 8/2012 | Washio et al. | 324/762.01 |
| 8,310,259 B2* | 11/2012 | Hamel et al. | 324/756.03 |
| 2007/0264878 A1 | 11/2007 | Hirobe et al. | |
| 2007/0279074 A1* | 12/2007 | Kasukabe et al. | 324/754 |
| 2011/0001506 A1* | 1/2011 | Washio et al. | 324/756.03 |
| 2011/0095779 A1* | 4/2011 | Washio et al. | 324/756.05 |
| 2011/0159444 A1 | 6/2011 | Hamada et al. | |

FOREIGN PATENT DOCUMENTS

| | | |
|---|---|---|
| CN | 1662819 A | 8/2005 |
| CN | 1947022 A | 4/2007 |
| CN | 101071140 A | 11/2007 |
| CN | 101421630 A | 4/2009 |
| JP | 10-510682 | 10/1998 |
| JP | 11-251383 | 9/1999 |
| JP | 2001102418 | 4/2001 |
| JP | 2004279141 | 10/2004 |
| JP | 2006-337080 | 12/2006 |
| JP | 2007003334 | 1/2007 |
| JP | 2007-113946 | 5/2007 |
| JP | 2007171140 | 7/2007 |
| JP | 2007285775 | 11/2007 |
| JP | 2008-145224 | 6/2008 |
| JP | 2009002865 | 1/2009 |
| JP | 2009-115477 | 5/2009 |
| JP | 2009099630 | 5/2009 |
| WO | 9706444 | 2/1997 |
| WO | 2004001428 | 12/2003 |
| WO | 2005103740 | 11/2005 |

\* cited by examiner

*Primary Examiner* — Jermele M Hollington
(74) *Attorney, Agent, or Firm* — Bryan A. Santarelli; Graybeal Jackson LLP

(57) ABSTRACT

An embodiment of an electrical connecting apparatus includes a chip unit having a plurality of electronic components arranged on the upper side of a chip supporting body, a probe unit having a plurality of contacts arranged on the lower side of a probe supporting body, and a connecting unit arranged between the chip unit and the probe unit and having a connecting member supporting body and a plurality of connecting members electrically connecting the chip unit to the probe unit. The chip unit, the probe unit and the connecting unit are vacuum-coupled.

13 Claims, 12 Drawing Sheets

ELECTRICAL CONNECTING APPARATUS AND TESTING SYSTEM USING THE SAME

PRIORITY CLAIM

The instant application claims priority to Japanese Patent Application No. 2009-243664, filed Oct. 22, 2009, which application is incorporated herein by reference in its entirety.

TECHNICAL FIELD

An embodiment relates to an electrical connecting apparatus and a testing system for use in a test of a semiconductor integrated circuit and more specifically relates to an electrical connecting apparatus suitable for a system testing multiple undiced integrated circuits formed on a wafer at a time or in several batches and a testing system

BACKGROUND

A system testing multiple undiced integrated circuits (that is, devices under test) formed on a semiconductor wafer at a time or in several batches generally comprises a test stage having a chuck top receiving the devices under test on the upper surface and an electrical connecting apparatus connecting the devices under test to external electrical circuits and arranged over the chuck top.

As one of such electrical connecting apparatuses, there is one comprising a chip unit having a chip supporting body and a plurality of test chips arranged on the upper side of the chip supporting body, a probe unit spaced downward from the chip unit and having a probe supporting body and a plurality of contacts arranged on the lower side of the probe supporting body, and a connecting unit arranged between the chip unit and the probe unit and having a pin supporting body and a plurality of connecting pins penetrating the pin supporting body in the up-down direction and enabling the upper end and the lower end to be protruded upward and downward from the pin supporting body (refer to Japanese Patent Appln. Public Disclosure No. H10-510682 and H11-251383).

In the aforementioned art, each test chip is connected to an external electrical circuit and has a function of generating electrical signals for use in an electrical test of a device under test and receiving and processing response signals from the device under test. Accordingly, with this art, since a plurality of wiring boards on which a plurality of circuits having functions of the test chips are arranged are not needed, the size of a test head is reduced more significantly than required more previously than this art, and a testing system becomes more reasonable.

However, in the aforementioned art, the chip unit, probe unit and connecting unit are just stacked in their thickness dimension. These three units are not coupled to or supported by a supporting unit.

SUMMARY

An embodiment releasably and firmly couples together a chip unit, probe unit, and connecting unit.

An electrical connecting apparatus according to an embodiment for electrically connecting devices under test to an external apparatus comprises a chip unit having a chip supporting body and a plurality of electronic components arranged on the upper side of the chip supporting body, a probe unit spaced downward from the chip unit and having a probe supporting body and a plurality of contacts arranged on the lower side of the probe supporting body, a connecting unit arranged between the chip unit and the probe unit and having a connecting member supporting body and a plurality of connecting members supported to the connecting member supporting body so as to electrically connect the chip unit to the probe unit, a first seal member arranged between the chip unit and the connecting unit to close a first space between the chip unit and the connecting unit from outside, a second seal member arranged between the probe unit and the connecting unit to close a second space between the probe unit and the connecting unit from outside, and first and second suction connecting portions respectively connecting the first and second spaces to a suction unit.

Either one out of the chip unit, the probe unit, and the connecting unit may have a supported portion supported to a supporting base provided in a testing system using the electrical connecting apparatus.

The first suction connecting portion may have a first hole provided in the chip unit and communicating into the first space, and the second suction connecting portion may have a second hole provided in the probe unit and communicating into the second space.

An electrical connecting apparatus according to an embodiment may further comprise a first valve arranged between the first suction connecting portion and the suction unit to releasably close suction path between the first suction connecting portion and the suction unit, a second valve arranged between the second suction connecting portion and the suction unit to releasably close suction path between the second suction connecting portion and the suction unit.

An electrical connecting apparatus according to an embodiment may further comprise a cover arranged over the chip unit to cover the electronic components.

An electrical connecting apparatus according to an embodiment may further comprise a positioning pin positioning the chip unit and the probe unit to the connecting unit.

The chip unit may have a second chip supporting body arranged above the chip supporting body so as to be spaced from it and a plurality of second electronic components arranged on the upper side of the second chip supporting body.

Each connecting member may include a connecting pin passing through the connecting member supporting body in the up-down direction, the chip supporting body may have a chip board on the upper side of which the electronic components are arranged and a first ring having a first opening in which the chip board is arranged, the probe supporting body may have a probe board on the lower side of which the contacts are arranged and a second ring having a second opening in which the probe board is arranged, the connecting member supporting body may have a plate-shaped pin holder in which the connecting pins are arranged in a state of passing therethrough in the up-down direction and a third ring having a third opening in which the pin holder is arranged. The first seal member may be arranged between the first and third rings, and the second seal member may be arranged between the second and third rings.

The third ring may have a ring portion extending around a virtual axis extending in the up-down direction via the chip supporting body, the connecting member supporting body, and the probe supporting body and a plurality of linear portions extending from the ring portion toward the virtual axis and coupled with one another at the center portion of the ring portion, and the pin holder may include a plurality of fan-like-plate-shaped pin supporting pieces arranged at spaces formed by the ring portion and the adjacent linear portions, each pin supporting piece holding plural connecting pins.

Each connecting pin may have a main portion passing through the pin holder in the up-down direction, an upper probe tip portion integrally continuing into the upper end of the main portion and protruded upward from the pin holder, and a lower probe tip portion integrally continuing into the lower end of the main portion and protruded downward from the pin holder.

Each connecting pin may include a pogo pin having a pair of pin members spaced in the up-down direction and a spring member arranged between the pin members to bias the pin members in directions in which their tip end portions are protruded upward and downward respectively from the pin supporting body, and the connecting member supporting body may have electrical insulating sheet members respectively arranged on the upper and lower surfaces of the pin holder and having holes allowing the tip end portions of the pin members to be protruded from the sheet members.

Each electronic component may include an integrated test chip generating electrical signals for use in an electrical test of the device under test and receiving and processing response signals from the device under test.

A testing system according to an embodiment comprises an electrical connecting apparatus as above, a supporting base supporting the electrical connecting apparatus, and a test stage having a chuck top arranged below the electrical connecting apparatus so as to receive the devices under test on the side of the electrical connecting apparatus.

The testing system according to an embodiment may further comprise a third seal member arranged between the test stage and the electrical connecting apparatus to close a third space between the test stage and the electrical connecting apparatus from outside, and a third suction connecting portion connecting the third space to a suction unit.

In an embodiment, the chip unit, the probe unit, and the connecting unit are vacuum-absorbed and releasably firmly coupled when the first space between the chip unit and the connecting unit and the second space between the probe unit and the connecting unit are suctioned by the suction unit such as a vacuum machine.

DETAILED DESCRIPTION

Figure 1:
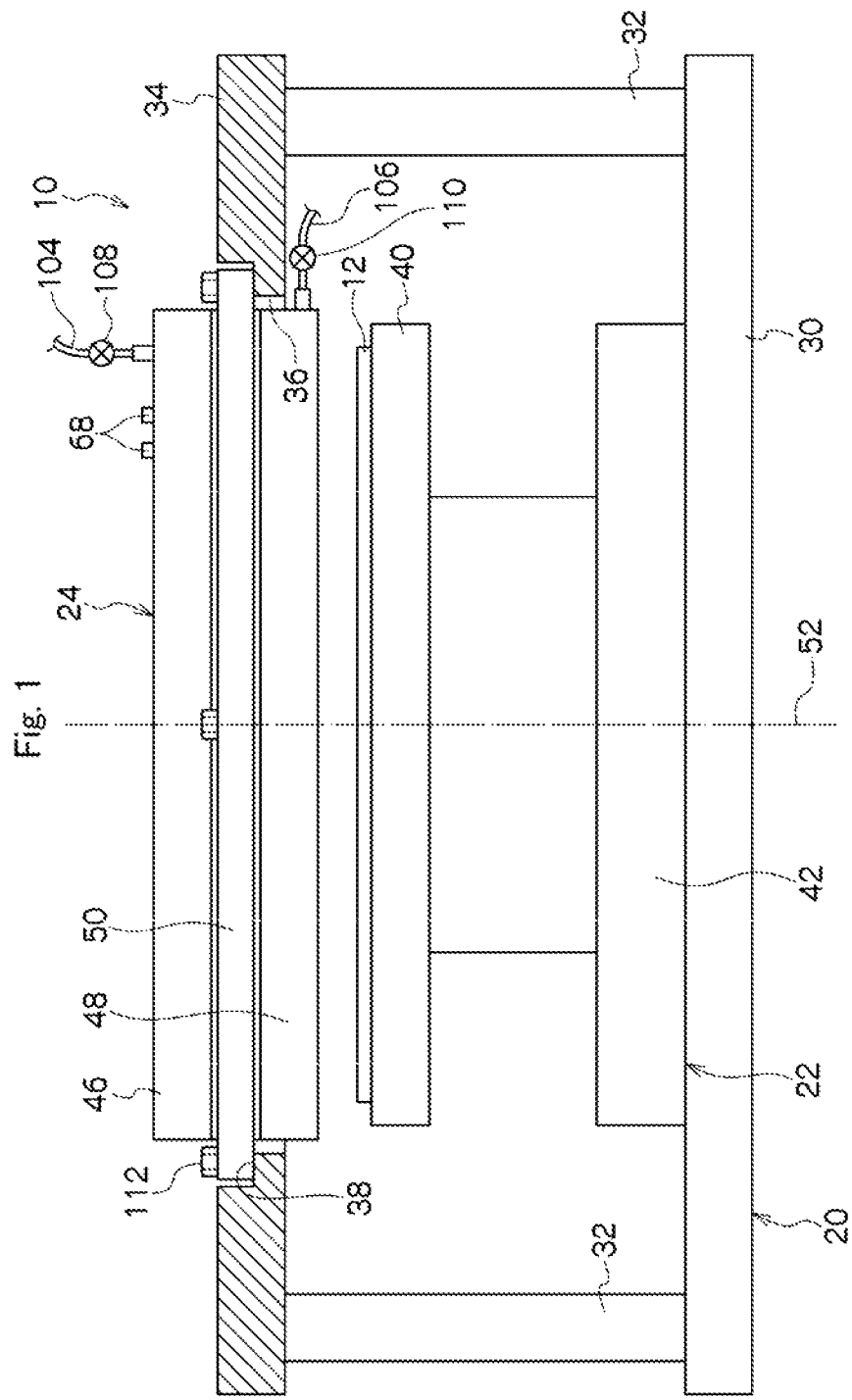
FIG. 1 is a front view showing an embodiment of a testing system, in which a supporting base is shown to be cross-sectional.

Components and their respective reference numbers.
10 testing system
12 semiconductor wafer
20 supporting unit
22 test stage
24 electrical connecting apparatus
26 external apparatus
34 supporting base
38 upward step
40 chuck top
42 stage moving mechanism
44 contact
46 chip unit
48 probe unit
50 connecting unit
52 theta axis
56, 132 test chip (electronic component)
58, 130 chip supporting body
60 chip board
62 ring
62a opening
62b flange portion
62c positioning hole
64, 78 internal wire
66, 146 connecting land
68, 70 connector
72 probe supporting body
74 probe board
76 ring
76a opening
76b flange portion
76c positioning hole
78 internal wire
80 connecting land
82 probe land
86 connecting pin
88, 182 pin supporting body
90 pin holder
92a opening
94 positioning pin
96, 124 seal member
100, 102, 122 through hole
104, 106, 126 pipe
108, 110, 128 valve
120 absorbing recess
136, 144 internal wire
138 brace
150 connecting unit
152 connecting pin (pogo pin)
154 cylindrical member
156, 158 pin member
160 coil spring
162 pin holder
164 holding sheet
170 connecting unit
172 ring
174 ring portion
176 linear portion
178 pin supporting piece of the pin holder An embodiment, in FIGS. 1 to 4, an up-down direction is referred to as an up-down direction or a Z direction, a right-left direction is referred to as a right-left direction or an X direction, and a direction in the back side of the drawing sheet is referred to as a front-back direction or a Y direction. However, these directions differ with the postures of a chip unit, probe unit and connecting unit in a state where these units are attached to a testing system.

Accordingly, an electrical connecting apparatus according to an embodiment may be used in a state where the up-down direction referred to in the present invention is actually one of any directions such as an up-down direction, an upside-down direction and an inclined direction when these three units are attached to a testing system.

Referring to FIG. 1, an embodiment of a testing system 10 tests or inspects multiple undiced integrated circuits (not shown) formed on a circular plate-shaped semiconductor wafer 12 at a time or in several batches with these integrated circuits being devices under test. Each integrated circuit as an object of an electrical test by the testing system 10 has a plurality of electrodes (not shown) such as pad electrodes on the upper surface.

The testing system 10 includes a supporting unit 20, a test stage 22 supported to the supporting unit 20 and receiving the wafer 12, a probe card or an electrical connecting apparatus 24 supported to the supporting unit 20 so as to be located over the stage 22 and transmitting and receiving electrical signals to and from the wafer 12, and an external apparatus 26 (refer to FIG. 2) having various electrical circuits.

In the supporting unit 20, braces 32 are attached respectively to plural locations, spaced in the X and Y directions, of a base plate 30 extending in the X and Y directions so as to extend upward, and a plate-shaped supporting base 34 is attached to the upper end portions of these braces 32 to be parallel to the base plate 30.

The supporting base 34 has a circular opening 36 that receives the electrical connecting apparatus 24. An edge portion located around the opening 36 and specifying the opening 36 is an upward step 38 receiving and supporting the electrical connecting apparatus 24.

The test stage 22 has a known mechanism in which a chuck top 40 having a plurality of absorbing recesses releasably vacuum-absorbing the wafer 12 is supported on the upper portion of a stage moving mechanism 42, and in which the chuck top 40 moves in the X, Y and Z directions or three-dimensionally and angularly rotates around a virtual theta axis 52 extending in the up-down direction by the stage moving mechanism 42.

Thus, prior to an electrical test, the wafer 12 moves three-dimensionally in the front-back, right-left and up-down directions and angularly rotates around the theta axis 52 in a state of being releasably vacuum-absorbed on the test stage 22 to be positioned so that each electrode of the integrated circuits may contact a probe tip of a plate-shaped contact 44.

The electrical connecting apparatus 24 includes a circular plate-shaped part unit or a chip unit 46, a circular plate-shaped probe unit 48 having the plurality of contacts 44, and a circular plate-shaped connecting unit 50 electrically connecting internal wires of these units 46 and 48.

In the electrical connecting apparatus 24, these three units 46, 48 and 50 are piled in the thickness direction and releasably vacuum-coupled and are generally formed in a circular plate shape, centering on the theta axis 52.

The aforementioned electrical connecting apparatus 24 will be described further in details with reference to FIGS. 2 to 8.

The chip unit 46 has plural (M) test chips each acting as an electronic component arranged on the upper side of a circular plate-shaped chip supporting body 58. Each test chip 56 corresponds to one of plural (N) devices under test (integrated circuits) that may be tested at a time.

Each test chip 56 is also an integrated circuit chip formed by dicing integrated circuits formed on a semiconductor wafer so as to generate electrical signals for use in an electrical test of each corresponding device under test and to receive and to process response signals from each corresponding device under test and executes an electrical test of each corresponding device under test.

Referring to FIGS. 2 to 6, the chip supporting body 58 has a circular plate-shaped chip board 60 having the plural test chips 56 arranged on the upper surface and a ring 62 extending around the chip board 60. The chip board 60 is received in an opening 62a (refer to FIGS. 3 and 4) of the ring 62 in a state where its upper and lower surfaces are exposed upward and downward, respectively.

The chip board 60 is a multilayered wiring board made, in a circular plate shape, of electrical insulating materials such as glass-containing epoxy, resins such polyimide, ceramics, and their laminated body. The chip board 60 has multiple internal wires 64, multiple connecting lands (not shown) connected to electrodes of the test chips 56 on the upper surface, multiple other connecting lands 66 on the lower surface, and a plurality of connectors 68 on the upper surface.

Figure 2:
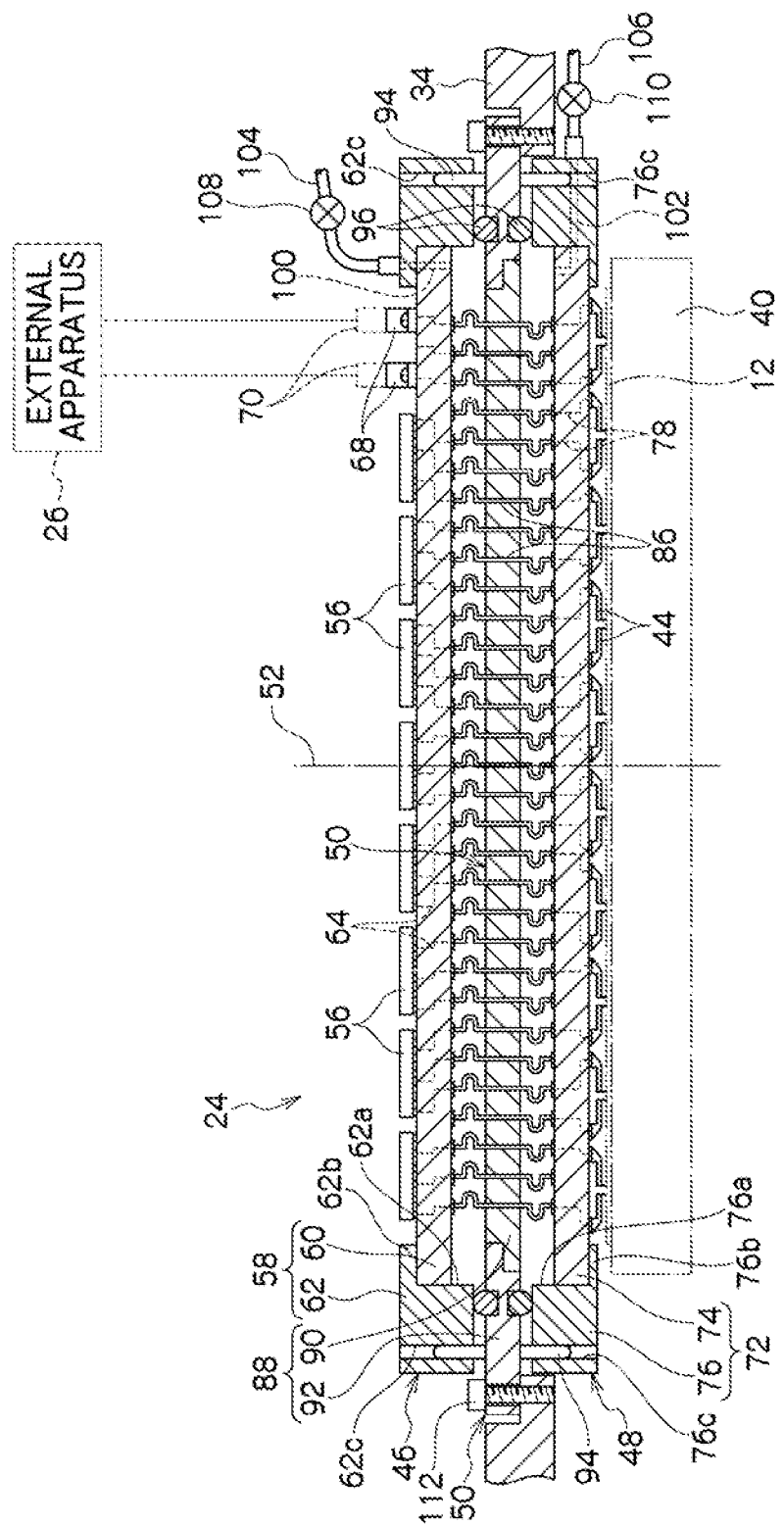
FIG. 2 is a cross-sectional view showing an embodiment of an electrical connecting apparatus.
Figure 3:
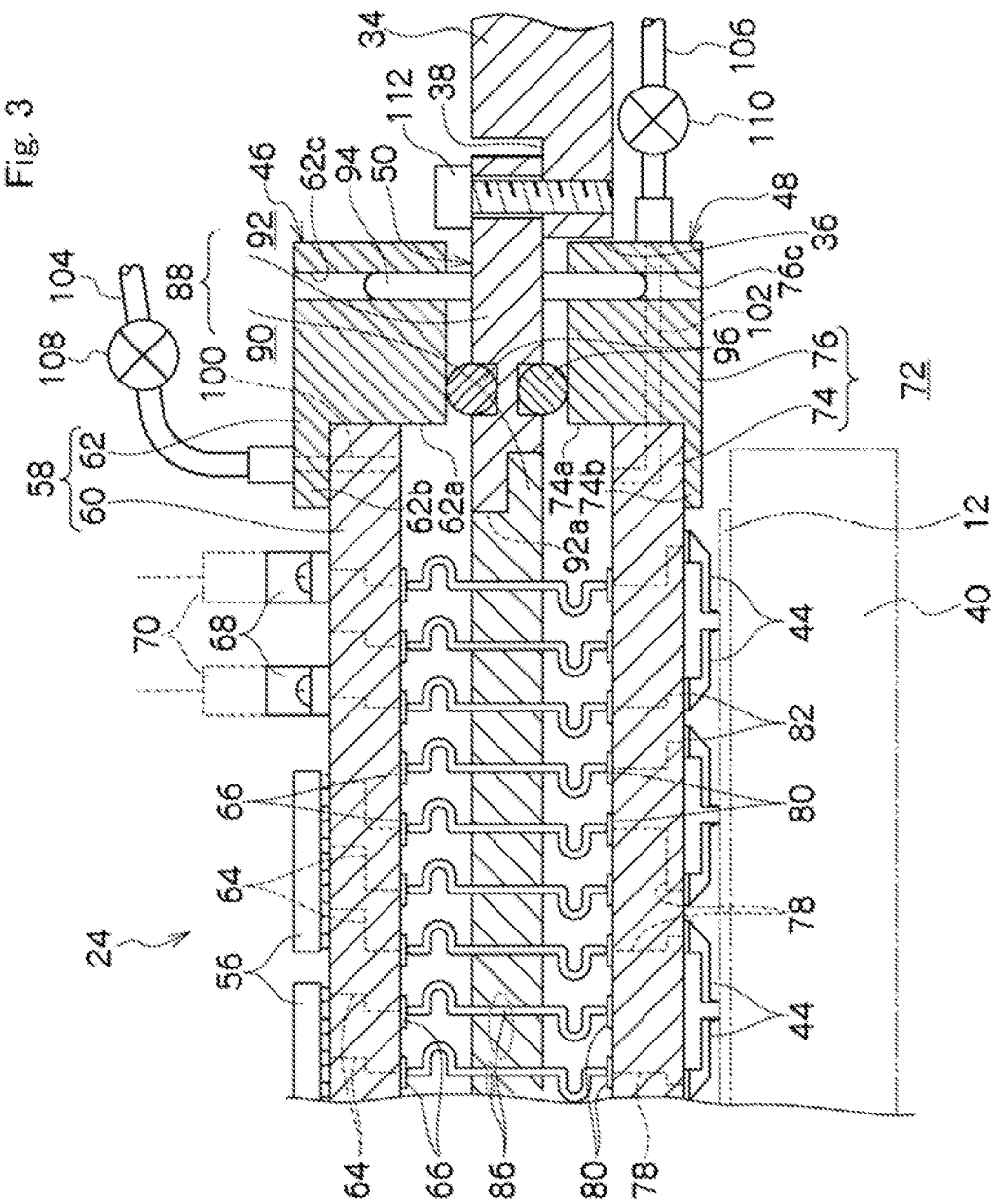
FIG. 3 is an enlarged cross-sectional view of coupling portions and their proximity of the electrical connecting apparatus according to an embodiment.
Figure 4:
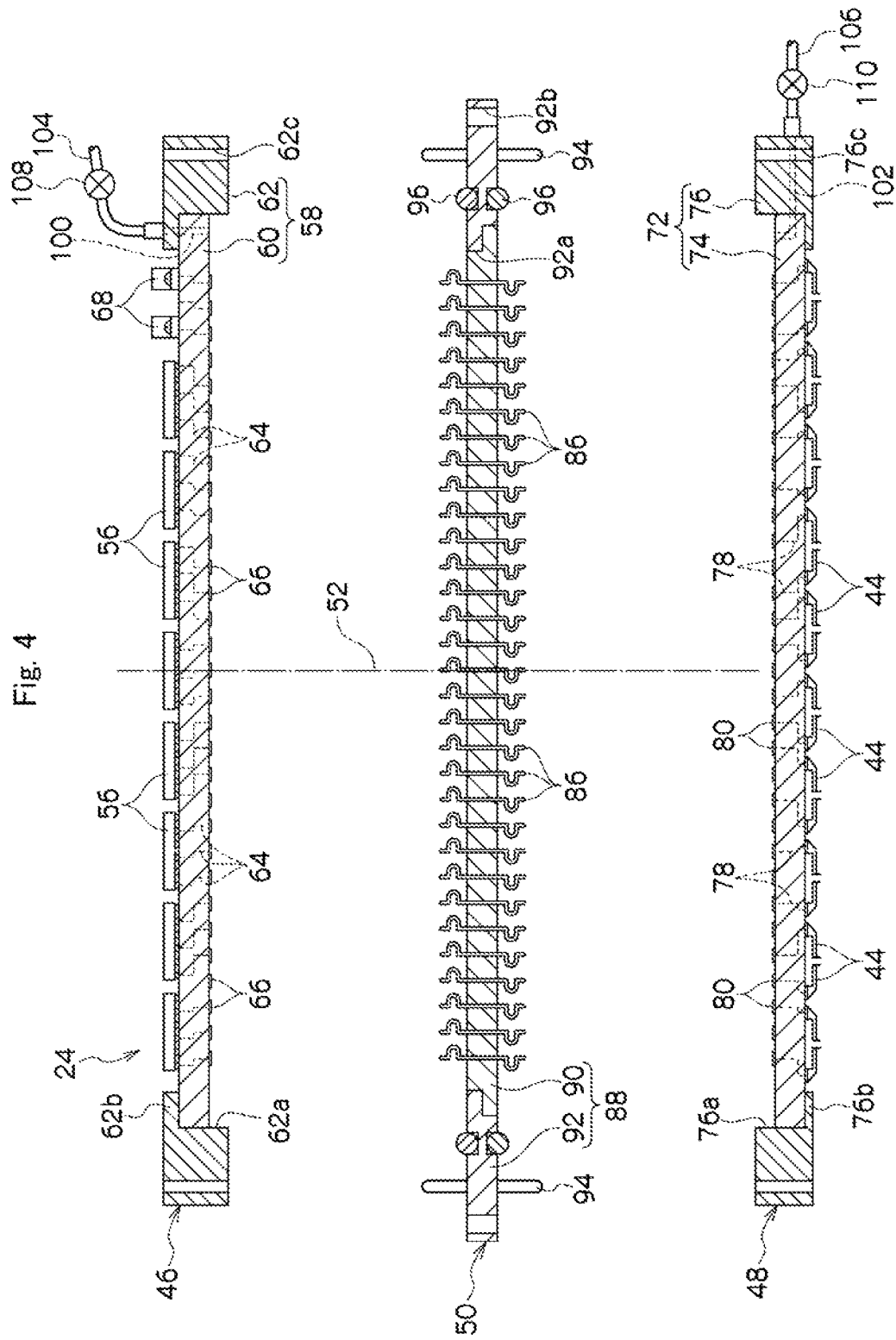
FIG. 4 is an exploded cross-sectional view of the electrical connecting apparatus according to an embodiment.
Figure 5:
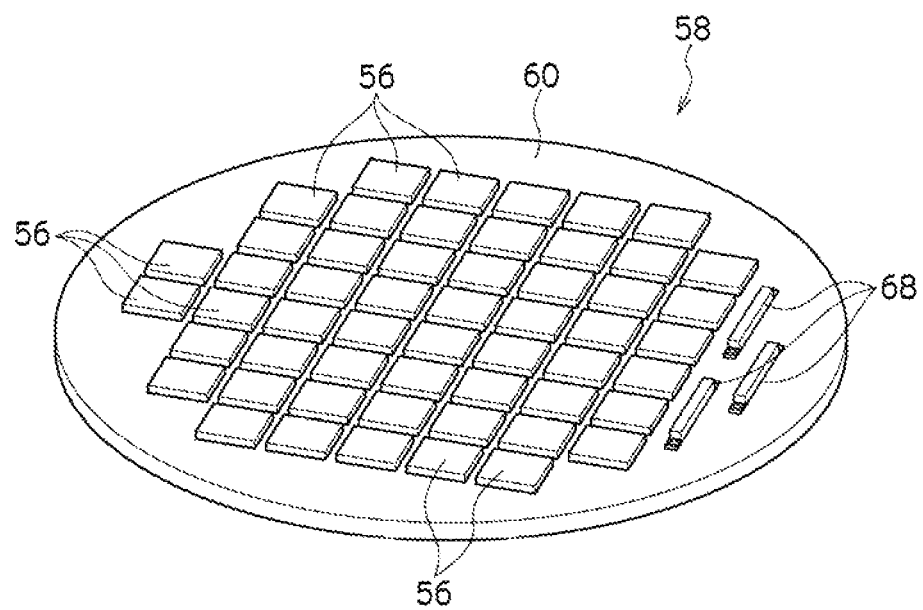
FIG. 5 is a perspective view of a chip board used in the electrical connecting apparatus seen from an oblique upper side according to an embodiment.
Figure 6:
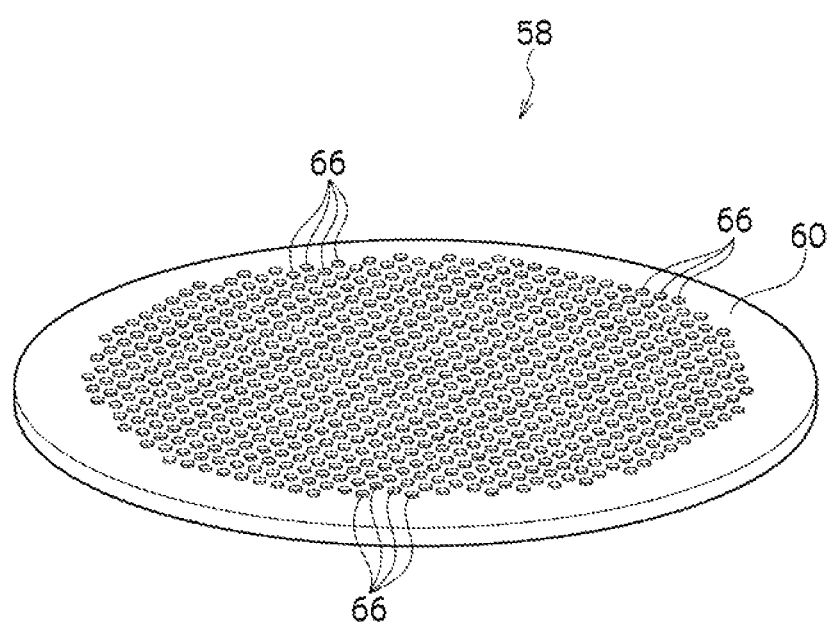
FIG. 6 is a perspective view of the chip board used in the electrical connecting apparatus seen from an oblique lower side according to an embodiment.
Figure 7:
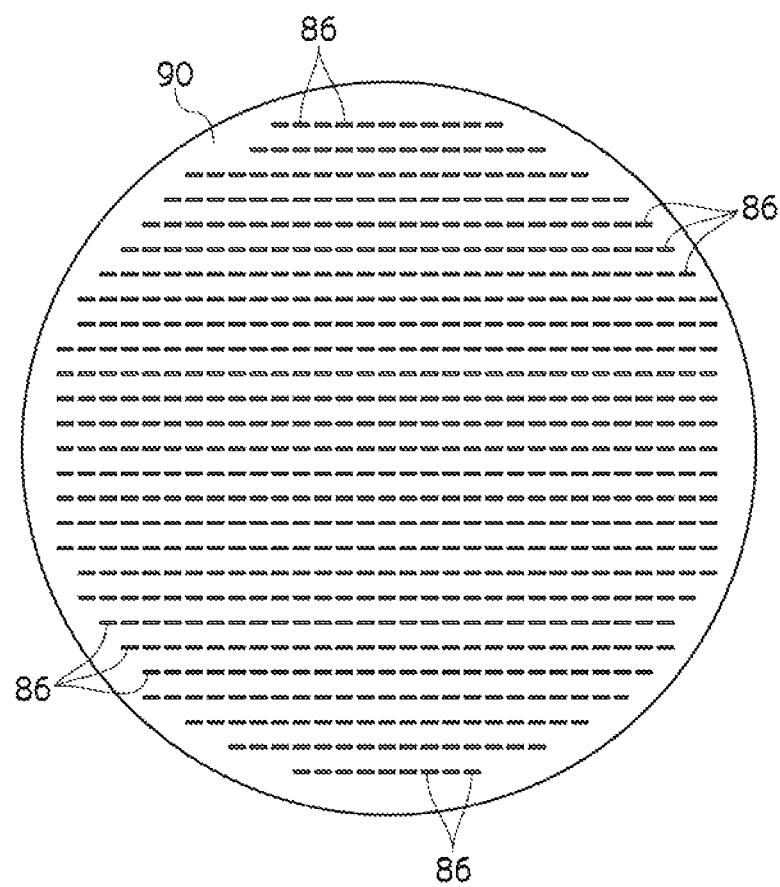
FIG. 7 is a plan view of a pin holder used in the electrical connecting apparatus according to an embodiment.
Figure 8:
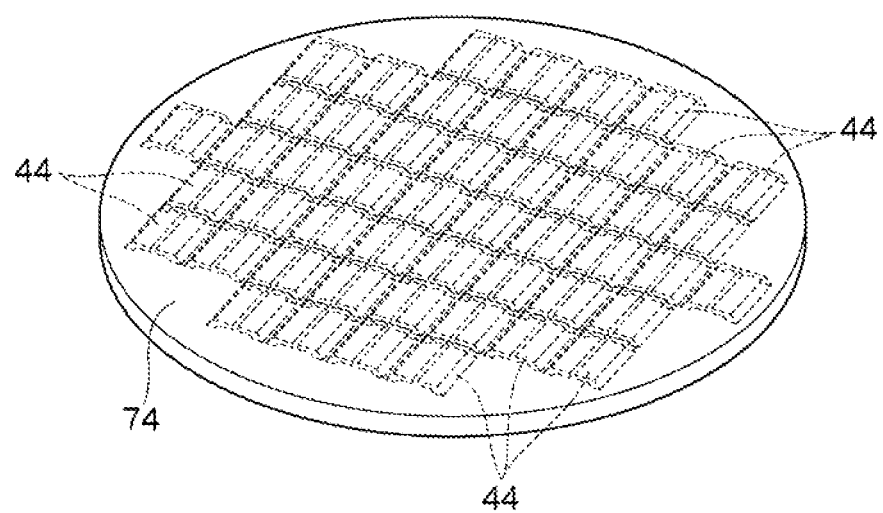
FIG. 8 is a perspective view of a probe board used in the electrical connecting apparatus seen from an oblique lower side according to an embodiment.

Among the multiple internal wires 64, the upper end portions of plural internal wires 64 are connected to the aforementioned not shown connecting lands connected to the electrodes of the test chips 56, and the upper end portions of the other plural internal wires 64 are connected to terminals of the connectors 68. The lower end portion of each internal wire 64 is connected to the connecting land 66. To each connector 68 is connected another connector 70 electrically connected to the external apparatus 26 as shown in FIGS. 1 and 2.

The ring 62 is a plate-shaped ring and has, on the inside of the upper end, an inward flange portion 62b protruded inward from the upper end portion and respectively, at plural locations spaced in the circumferential direction, positioning holes 62c penetrating in the up-down direction.

The chip board 60 and the ring 62 are releasably coupled by a plurality of screw members (not shown) in a state where the outer circumferential portion on the upper surface of the chip board 60 is thrust on the lower surface of the flange portion 62b to maintain airtightness and in a state where the ring 62 extends coaxially around the chip board 60. However, the outer circumferential portion on the upper surface of the chip board 60 and the lower surface of the flange portion 62b may be coupled by adhesive in a state of maintaining airtightness.

Referring to FIGS. 2 to 4 and 8, the probe unit 48 has the plurality of contacts 44 arranged on the lower side of a circular plate-shaped probe supporting body 72. The probe supporting body 72 has a circular plate-shaped probe board 74 having the plural contacts 44 arranged on the lower surface and a ring 76 extending around the probe board 74. The probe board 74 is received in an opening 76a of the ring 76 in a state where its upper and lower surfaces are exposed upward and downward, respectively.

The probe board 74 is a wiring board made of electrical insulating materials such as glass-containing epoxy and, resins such as polyimide, ceramics, and their laminated body in a similar manner to that of the chip board 60 and formed in a circular plate shape having approximately the same diameter dimension as that of the chip board 60. The probe board 74 has multiple internal wires 78, plural connecting lands 80

(refer to FIG. 3) on the upper surface, and plural probe lands 82 (refer to FIG. 3) on the lower surface.

Each contact 44 is a known contact having a seat portion (attaching region) extending in the up-down direction, an arm region extending from the lower end portion of the seat portion in the X or Y direction, and a probe tip region protruded downward from the tip end portion of the arm region, an embodiment of which is described in Japanese National Patent Appln. Public Disclosure No. 2006-337080, Japanese National Patent Appln. Public Disclosure No. 2007-113946, Japanese National Patent Appln. Public Disclosure No. 2009-115477, which are incorporated by reference.

Each contact 44 is fixed at the upper end portion of the seat portion on the probe land 82 in a cantilevered manner by an appropriate means such as soldering, welding or the like in a state where the arm region extends in the X or Y direction and where the probe tip region is protruded downward. The upper end portion and the lower end portion of each internal wire 78 are connected to the connecting land 80 and the probe land 82, respectively.

The ring 76 is a plate-shaped ring in a similar manner to that of the ring 62 and has, on the inside of the lower end, an inward flange portion 76b protruded inward from the lower end portion and respectively, at plural locations spaced in the circumferential direction, positioning holes 76c penetrating in the up-down direction.

Similar to coupling of the chip board 60 and the ring 62, the probe board 74 and the ring 76 are releasably coupled by a plurality of screw members (not shown) in a state where the outer circumferential portion on the lower surface of the probe board 74 is thrust on the upper surface of the flange portion 76b to maintain airtightness and in a state where the ring 76 extends coaxially around the probe board 74. However, the outer circumferential portion on the lower surface of the probe board 74 and the upper surface of the flange portion 76b may be coupled by adhesive in a state of maintaining airtightness.

As shown in FIGS. 2, 3, 4 and 7, the connecting unit 50 has a circular plate-shaped pin supporting body 88 supporting multiple connecting pins 86 electrically connecting the connecting lands 66 to the connecting lands 80. The pin supporting body 88 has a circular plate-shaped pin holder 90 support the connecting pins 86 in a state where these connecting pins 86 penetrate the pin holder 90 in the up-down direction. The pin holder 90 is received in an opening 92a of a plate-shaped ring 92.

The pin holder 90 and the ring 92 have an upward step and a downward step at the outer circumferential portion and the inner circumferential portion, respectively, and are releasably coupled by a plurality of screw members (not shown) in a state where these steps are mutually thrust to maintain airtightness and in a state where the ring 92 is coaxially located around the pin holder 90. However, the aforementioned steps may be coupled by adhesive in a state of maintaining airtightness.

Each connecting pin 86 is made of a conductive material to be formed in a thin wire shape or a plate shape and has a main portion passing through the pin holder 90 in the thickness direction, a laid U-shaped upper probe tip portion integrally continuing into the upper portion of the main portion, and a laid U-shaped lower probe tip portion integrally continuing into the lower portion of the main portion. The upper end portion of the upper probe tip portion and the lower end portion of the lower probe tip portion are protruded upward and downward from the pin holder 90, respectively.

The ring 92 is a plate-shaped ring in a similar manner to that of the ring 62 and has respectively, at plural locations spaced in the circumferential direction, positioning pins 94 protruded in the up-down direction. Each positioning pin 94 corresponds to one of the positioning holes 62c and 76c and is inserted in the corresponding positioning hole 62c or 76c.

In this manner, the chip unit 46 and the probe unit 48 are positioned to the connecting unit 50, are combined in a correct positional relationship in which each connecting pin 86 contacts to the corresponding lands 66 and 80, and are coupled coaxially with the pin supporting body 88 with the theta axis 52 being a common central axis.

The ring 92 has an annular recess extending around the theta axis 52 and opened to the chip unit 46 side and an annular recess extending around the theta axis 52 and opened to the probe unit 48 side. In each recess is arranged an annular seal member 96 such as an O ring packing.

In a state where the chip unit 46, the probe unit 48 and the connecting unit 50 are coupled, each seal member 96 maintains a space between the chip unit 46 and the connecting unit 50 or a space between the probe unit 48 and the connecting unit 50 to be airtight against an external space around the electrical connecting apparatus 24.

The chip unit 46 and the probe unit 48 are firmly coupled with the connecting unit 50 as each space on side of the connecting unit 50 is kept at lower pressure, as described later.

However, prior to keeping these spaces at lower pressure, the chip unit 46 and the probe unit 48 may be temporarily fixed to the connecting unit 50 by plural screw members to prevent separation of the chip unit 46, the probe unit 48 and the connecting unit 50.

To exhaust air in the spaces of the chip unit 46 and the probe unit 48 on the connecting unit 50 sides, the chip unit 46 and the probe unit 48 respectively have through holes 100 and 102 each communicating the space on the connecting unit 50 side into the external space. In the example shown in the figures, the through hole 100 is provided in the chip board 60 and the ring 62, and the through hole 102 is provided in the probe board 74 and the ring 76.

The through holes 100 and 102 are connected via pipes 104 and 106 to a common or separated suction unit(s) (not shown) such as a vacuum machine and act as connecting portions to the suction unit, respectively. The pipes 104 and 106 have valves 108 and 110 that open and close their airflow paths, respectively.

As described above, the chip unit 46 and the probe unit 48 are coupled with the connecting unit 50 as the respective spaces on the connecting unit 50 sides are depressurized by the suction unit and then kept at lower pressure than the external space by closure of the valves 108 and 110.

Separation of the chip unit 46 and the probe unit 48 from the connecting unit 50 may be done by making the spaces on the connecting unit 50 sides at atmospheric pressure.

The electrical connecting apparatus 24 is releasably coupled with the supporting base 34 and is supported to the supporting unit 20 by having a plurality of screw members 112 pass through holes 92b (refer to FIG. 4) of the ring 92 and screw into the supporting base 34 in a state where the circumferential portion of the ring 92 is mounted on the upward step 38 of the supporting base 34.

At the time of a test, the probe tip of each contact 44 is thrust to the corresponding electrode of the device under test, in which state test signals are supplied from each test chip 56 to the device under test, and response signals from each device under test are outputted to the corresponding test chip 56. Each test chip 56 judges whether the corresponding device under test is good or not good based on the response signals from the device under test.

The mutual thrusting forces between the connecting pins 86 and the lands 66 and between the connecting pins 86 and the lands 80 may be adjusted by changing the pressure in the space between the chip unit 46 and the connecting unit 50 and the pressure in the space between the probe unit 48 and the connecting unit 50 into appropriate values. The changeability or adjustability of the thrusting forces between the connecting pins 86 and the connecting lands 66 and between the connecting pins 86 and the connecting lands 80 as above brings about the following advantages.

The mutual thrusting force between the connecting pins 86 and the lands 66 and the mutual thrusting force between the connecting pins 86 and the lands 80 can be changed or adjusted to individual values or an identical value depending on the type of the devices under test. Also, the mutual thrusting forces between the connecting pins 86 and the lands 66 and between the connecting pins 86 and the lands 80 may be changed or adjusted in accordance with the mutual thrusting force between the electrodes of the devices under test and the contacts 44.

As a result of the above, in a test of devices under test using radio frequency signals having weak current and weak voltage such as integrated circuits, the contact resistance values at the contact portions between the connecting lands 66 and the connecting pins 86 and between the connecting lands 80 and the connecting pins 86 may be set to optimal values.

Figure 9:
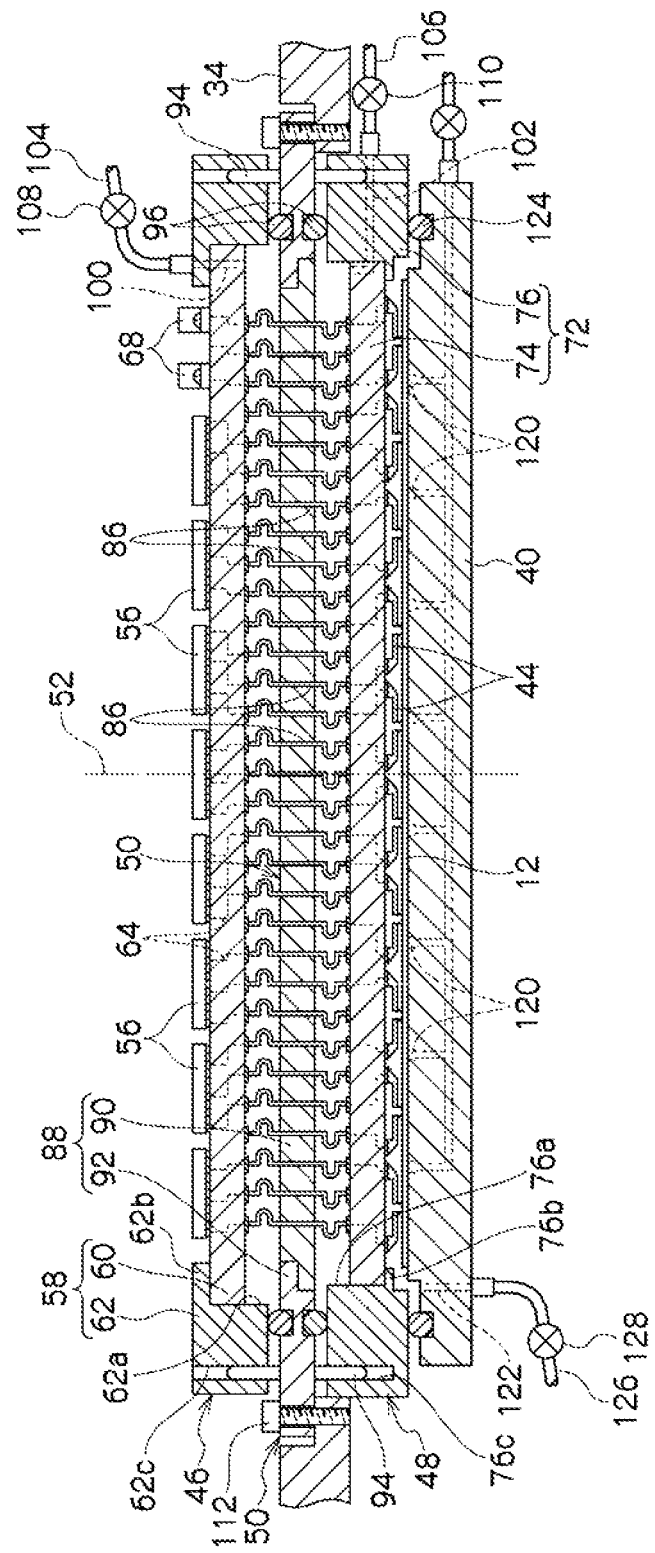
FIG. 9 is a cross-sectional view showing another embodiment of the electrical connecting apparatus and a chuck top.

Referring to FIG. 9, in an embodiment, the chuck top 40 has a plurality of absorbing recesses 120 connected to a vacuum source so as to releasably vacuum-absorb the semiconductor wafer 12, a through hole 122 communicating the space between the chuck top 40 and the probe unit 48 into the external space, and an annular recess extending around the theta axis 52 and opened to the probe unit 48 side. An annular seal member 124 such as an O ring packing is arranged in the recess.

The through hole 122 is connected via a pipe 126 to a suction unit (not shown) to exhaust air in the space between the chuck top 40 and the probe unit 48 and acts as a connecting portion to the suction unit. The pipe 126 has a valve 128 that opens and closes its airflow path. The suction unit to which the pipe 126 is connected may be common to or separated from the suction unit to which the pipes 104 and 106 are connected.

The chuck top 40 and the probe unit 48 are coupled with each other as the space between them is depressurized by the suction unit and then kept at lower pressure than the external space by closure of the valve 128.

Separation of the probe unit 48 from the chuck top 40 may be done by making the space between them at atmospheric pressure. The pressure between each contact 44 and the electrode of the device under test (that is, the probe pressure) may be adjusted by changing the pressure in the space between the chuck top 40 and the probe unit 48 into an appropriate value.

As a result of the above, in a test of devices under test using radio frequency signals having weak current and weak voltage such as integrated circuits, the contact resistance value at the contact portions between the electrodes of the devices under test and the probe tips of the contacts may be set to an optimal value.

Figure 10:
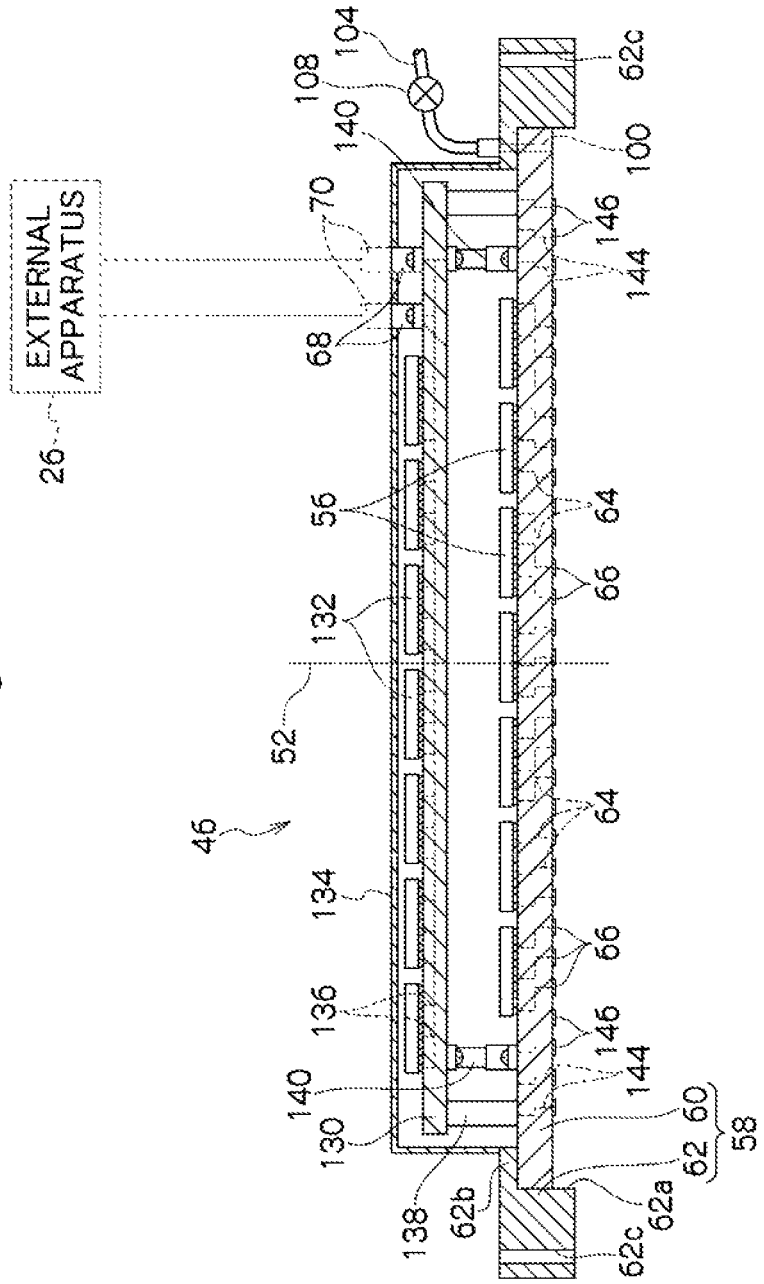
FIG. 10 is a cross-sectional view showing another embodiment of a chip unit.

Referring to FIG. 10, in an embodiment, the chip unit 46 further has a circular plate-shaped second chip supporting body 130 arranged above the chip board 60 of the chip supporting body 58 so as to be spaced from it and a plurality of second test chips 132 arranged on the upper side of the chip supporting body 130. The connector 68 is arranged on the chip supporting body 130.

The chip supporting body 130 is a multilayered wiring board made, in a circular plate shape, of electrical insulating materials similar to the chip board 60 and has multiple internal wires 136, multiple connecting lands (not shown) connected to electrodes of the test chips 132 on the upper surface, and multiple other connecting lands (not shown) on the lower surface. The chip supporting body 130 is supported by a plurality of braces 138 extending upward from the chip board 60 to be parallel to the chip board 60.

Among the multiple internal wires 136, the upper end portions of plural internal wires 136 are connected to the not shown connecting lands connected to the electrodes of the test chips 132, and the upper end portions of the other plural internal wires 136 are connected to terminals of the connectors 68. The lower end portions of the respective internal wires 136 are connected to the not shown other connecting lands provided on the lower surface of the chip supporting body 130.

Each of the other connecting lands provided on the lower surface of the chip supporting body 130 is electrically connected via an electrical connecting tool 140 such as a connector to an internal wire 144 provided in the chip board 60. The lower end portion of each internal wire 144 is connected to a connecting land 146 provided on the lower surface of the chip board 60.

Each test chip 132 acts as an electronic component having the same function as that of the test chip 56 and operated in the same manner as that of the test chip 56.

With the system shown in FIG. 10, since more contacts 44 and test chips 56, 132 may be arranged than in the case of the system shown in FIGS. 1 to 4, more devices under test may be tested simultaneously at a time, which results in improvement of test efficiency.

In an embodiment shown in FIG. 10, the electrical connecting apparatus further includes a cover 134 arranged over the chip unit 46 to cover the test chips 56, 132. This protects the test chips 56, 132 from surrounding dust. A cover of the same kind as the cover 134 may be arranged over the electrical connecting apparatus shown in FIGS. 1 to 4.

Figure 11:
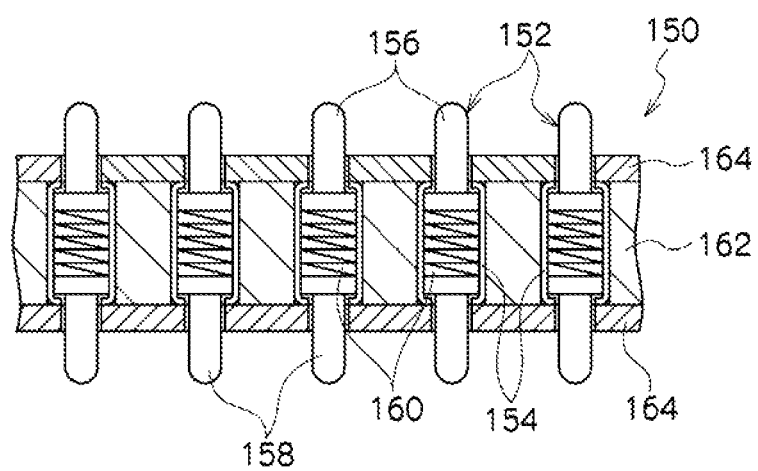
FIG. 11 is a cross-sectional view showing a part of a connecting unit using other connecting pins according to an embodiment.

Referring to FIG. 11, in an embodiment a pin supporting body 150 uses pogo pins as connecting pins 152.

Each pogo pin or each connecting pin 152 has a cylindrical member 154, a first pin member 156 arranged at one end portion of the cylindrical member 154 to be movable in the longitudinal direction of the cylindrical member 154, a second pin member 158 arranged at the other end portion of the cylindrical member 154 to be movable in the longitudinal direction of the cylindrical member 154, and a compression coil spring 160 residing in the cylindrical member 154 and arranged between the first pin member 156 and the second pin member 158 to bias the first pin member 156 and the second pin member 158 in directions in which the tip end portions are protruded from one end portion and the other end portion of the cylindrical member 154, respectively (that is, directions in which the first pin member 156 and the second pin member 158 are away from each other).

The cylindrical member 154, the first and second pin members 156 and 158, and the coil spring 160 are all made of a conductive material. The first and second pin members 156 and 158 are undetachably held in the cylindrical member 154.

Each connecting pin 152 is undetachably kept in a circular plate-shaped pin holder 162 at the cylindrical member 154 in a state where the cylindrical member 154 passes through a through hole of the pin holder 162. On both the upper and lower surfaces of the pin holder 162 are respectively fixed holding sheets 164 made of an electrical insulating material. The first and second pin members 156 and 158 penetrate the upper and lower sheet members 164 and are protruded upward and downward, respectively.

However, the cylindrical member 154 does not penetrate both the sheet members 164, but its upper end and lower end abut on the sheet members 164. This prevents each connecting pin 152 from being detached from the pin holder 162 as the cylindrical member 154 is located at the pin holder 162.

Figure 12:
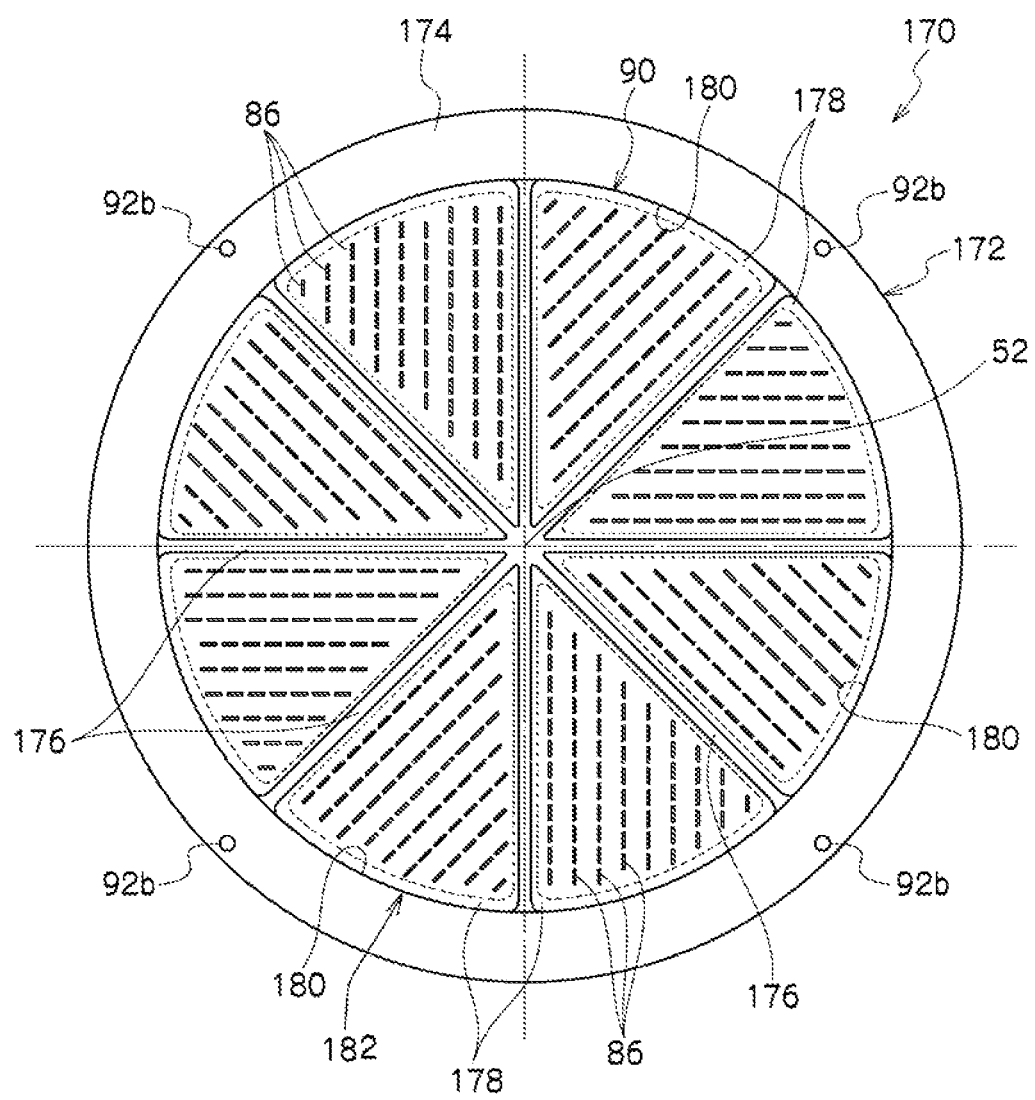
FIG. 12 is a plan view showing another embodiment of the connecting unit.

Referring to FIG. 12, in an embodiment a plate-shaped ring 172 of a connecting unit 170 has a ring portion 174 extending around the theta axis 52 and a plurality of linear portions 176 extending from the ring portion 174 toward the center of the curvature radius of the ring portion 174 and coupled with one another at the center portion of the ring portion 174.

A pin supporting body 182 has a plurality of fan-like-plate-shaped pin supporting pieces 178 arranged at each space 180 formed by the ring portion 174 and the adjacent linear portions 176. In each pin supporting piece 178 are held the plurality of connecting pins 86 in a state of passing through the pin supporting piece 178. These pin supporting pieces 178 collaboratively form a pin holder.

On the inside of the ring portion 174 and on both the side portions of each linear portion 176 are formed step portions receiving the pin supporting pieces 178. The pin supporting piece 178 is attached to the step portion of the ring portion 174 by a plurality of screw members (not shown).

With the above connecting unit 170, the pin supporting body 182 is reinforced by the plurality of linear portions 176 extending from the ring portion 174 toward the theta axis 52 and coupled with one another at the center portion. Accordingly, even when the probe unit 48, especially the center portion of the probe board 80, is to be deformed upward by thermal expansion in a high-temperature test, such thermal deformation is restricted. As a result, changes in positions of the probe tips of the contacts 44 caused by the thermal deformation are prevented.

In each of the above embodiments, each contact 44 may be a known contact having different structure and shape such as one using a thin metallic wire as described in Japanese National Patent Appln. Public Disclosure No. 2008-145224, which is incorporated by reference one using a pogo pin having shape and structure as shown in FIG. 11, etc.

An embodiment may be applied to a system using as each electronic component another component such as a relay, a capacitor, a resistor or the like instead of the test chip having the aforementioned function.

The present disclosure is not limited to the above embodiments, but may be altered in various ways without departing from the spirit and scope of the present disclosure.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is::

1. An electrical connecting apparatus electrically connecting devices under test to an external apparatus, comprising:
   a chip unit having a chip supporting body and a plurality of electronic components arranged on the upper side of said chip supporting body;
   a probe unit spaced downward from said chip unit and having a probe supporting body and a plurality of contacts arranged on the lower side of said probe supporting body;
   a connecting unit arranged between said chip unit and said probe unit and having a connecting member supporting body and a plurality of connecting members supported to said connecting member supporting body so as to electrically connect said chip unit to said probe unit;
   a first seal member arranged between said chip unit and said connecting unit to close a first space between said chip unit and said connecting unit from outside;
   a second seal member arranged between said probe unit and said connecting unit to close a second space between said probe unit and said connecting unit from outside;
   first and second suction connecting portions respectively connecting said first and second spaces to a suction unit;
   wherein each said connecting member includes a connecting pin passing through said connecting member supporting body in the up-down direction;
   wherein said chip supporting body has a chip board on the user side of which said electronic components are arranged and a first ring having a first opening in which said chip board is arranged;
   wherein said probe supporting body has a probe board on the lower side of which said contacts are arranged and a second ring having a second opening in which said probe board is arranged;
   wherein said connecting member supporting body has a plate-shaped pin holder in which said connecting pins are arranged in a stare of passing therethrough in the up-down direction and a third ring having a third opening in which said pin holder is arranged; and
   wherein said first seal member is arranged between said first and third rings, and said second seal member is arranged between said second and third rings.

2. The electrical connecting apparatus according to claim 1, wherein either one out of said chip unit, said probe unit, and said connecting unit has a supported portion supported to a supporting base provided in a testing system using said electrical connecting apparatus.

3. The electrical connecting apparatus according to claim 1, wherein said first suction connecting portion has a first hole provided in said chip unit and communicating into said first space, and said second suction connecting portion has a second hole provided in said probe unit and communicating into said second space.

4. The electrical connecting apparatus according to claim 1, further comprising a first valve arranged between said first suction connecting portion and said suction unit to releasably close suction path between said first suction connecting portion and said suction unit, a second valve arranged between said second suction connecting portion and said suction unit to releasably close suction path between said second suction connecting portion and said suction unit.

5. The electrical connecting apparatus according to claim 1, further comprising a cover arranged over said chip unit to cover said electronic components.

6. The electrical connecting apparatus according to claim 1, further comprising a positioning pin positioning said chip unit and said probe unit to said connecting unit.

7. The electrical connecting apparatus according to claim 1, wherein said chip unit has a second chip supporting body arranged above said chip supporting body so as to be spaced from it and a plurality of second electronic components arranged on the upper side of said second chip supporting body.

8. The electrical connecting apparatus according to claim 1;
   wherein said third ring has a ring portion extending around a virtual axis extending in the up-down direction via said chip supporting body, said connecting member supporting body, and said probe supporting body and a plurality of linear portions extending from said ring portion toward said virtual axis and coupled with one another at the center portion of said ring portion; and wherein said pin holder includes a plurality of fan-like-plate-shaped pin supporting pieces arranged at spaces formed by said ring portion and said adjacent linear portions, each pin supporting piece holding plural connecting pins.

9. The electrical connecting apparatus according to claim 1, wherein each said connecting pin has a main portion passing through said pin holder in the up-down direction, an upper probe tip portion integrally continuing into the upper end of said main portion and protruded upward from said pin holder, and a lower probe tip portion integrally continuing into the lower end of said main portion and protruded downward from said pin holder.

10. The electrical connecting apparatus according to claim 1;

wherein each connecting pin includes a pogo pin having a pair of pin members spaced in the up-down direction and a spring member arranged between said pin members to bias said pin members in directions in which their tip end portions are protruded upward and downward respectively from said pin supporting body; and wherein said connecting member supporting body has electrical insulating sheet members respectively arranged on the upper and lower surfaces of said pin holder and having holes allowing the tip end portions of said pin members to be protruded from said sheet members.

11. The electrical connecting apparatus according to claim 1, wherein each said electronic component includes an integrated test chip generating electrical signals for use in an electrical test of said device under test and receiving and processing response signals from said device under test.

12. A testing system, comprising:

an electrical connecting apparatus electrically connecting devices under test to an external apparatus, the electrical connecting apparatus including a chip unit having a chip supporting body and a plurality of electronic components arranged on the upper side of said chip supporting body, a probe unit spaced downward from said chip unit and having a probe supporting body and a plurality of contacts arranged on the lower side of said probe supporting body, a connecting unit arranged between said chip unit and said probe unit and having a connecting member supporting body and a plurality of connecting members supported to said connecting member supporting body so as to electrically connect said chip unit to said probe unit, a first seal member arranged between said chip unit and said connecting unit to close a first space between said chip unit and said connecting unit from outside, a second seal member arranged between said probe unit and said connecting unit to close a second space between said probe unit and said connecting unit from outside, first and second suction connecting portions respectively connecting said first and second spaces to a suction unit, wherein each said connecting member includes a connecting pin passing through said connecting member supporting body in the us-down direction, wherein said chip supporting body has a chip board on the upper side of which said electronic components are arranged and a first ring having a first opening in which said chip board is arranged, wherein said probe supporting body has a probe board on the lower side of which said contacts are arranged and a second ring having a second opening in which said probe board is arranged, wherein said connecting member supporting body has a plate-shaped pin holder in which said connecting pins are arranged in a state of passing therethrough in the up-down direction and a third ring having a third opening in which said pin holder is arranged, and wherein said first seal member is arranged between said first and third rings, and said second seal member is arranged between said second and third rings;

a supporting base supporting said electrical connecting apparatus; and a test stage having a chuck top arranged below said electrical connecting apparatus so as to receive said devices under test on the side of said electrical connecting apparatus.

13. The testing system according to claim 12, further comprising:

a third seal member arranged between said test stage and said electrical connecting apparatus to close a third space between said test stage and said electrical connecting apparatus from outside; and a third suction connecting portion connecting said third space to a suction unit.

* * * * *

UNITED STATES PATENT AND TRADEMARK OFFICE
CERTIFICATE OF CORRECTION

| | |
|---|---|
| PATENT NO. | : 8,525,539 B2 |
| APPLICATION NO. | : 12/907878 |
| DATED | : September 3, 2013 |
| INVENTOR(S) | : Kenichi Washio et al. |

Page 1 of 1

It is certified that error appears in the above-identified patent and that said Letters Patent is hereby corrected as shown below:

In the Claims

Column 12, line 25, the phrase "are arranged in a stare of passing therethrough" should read --are arranged in a state of passing therethrough--

Column 14, line 17, the phrase "supporting body in the us-down direction," should read --supporting body in the up-down direction,--

Signed and Sealed this
Seventeenth Day of June, 2014

Michelle K. Lee
*Deputy Director of the United States Patent and Trademark Office*